United States Patent
Brueck et al.

(10) Patent No.: US 10,578,783 B2
(45) Date of Patent: Mar. 3, 2020

(54) OPTICAL GRATING AND OPTICAL ASSEMBLY FOR SAME

(71) Applicant: Carl Zeiss SMT GmbH, Oberkochen (DE)

(72) Inventors: Sebastian Brueck, Ulm (DE); Michael Gerhard, Aalen (DE); Vitaliy Shklover, Koenigsbronn (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/239,045

(22) Filed: Jan. 3, 2019

(65) Prior Publication Data

US 2019/0137668 A1     May 9, 2019

Related U.S. Application Data

(63) Continuation of application No. PCT/EP2017/063831, filed on Jun. 7, 2017.

(30) Foreign Application Priority Data

Jul. 6, 2016    (DE) .................. 10 2016 212 361

(51) Int. Cl.
     *G02B 5/18*          (2006.01)
     *G03F 7/20*          (2006.01)
     *G21K 1/06*         (2006.01)

(52) U.S. Cl.
     CPC ......... *G02B 5/1838* (2013.01); *G02B 5/1814* (2013.01); *G02B 5/1861* (2013.01);
(Continued)

(58) Field of Classification Search
CPC .. G02B 5/1838; G02B 5/1814; G02B 5/1861; G03F 7/70316; G03F 7/70575; G03F 7/70958; G21K 1/067
See application file for complete search history.

(56) References Cited

U.S. PATENT DOCUMENTS 6,185,043 B1 *   2/2001   Imamura ................ G02B 1/105
                                                          359/566
8,116,002 B2 *   2/2012   Hoose ................... G02B 5/1861
                                                          359/350
(Continued)

FOREIGN PATENT DOCUMENTS

DE       102015203572 A1    6/2015
WO         03058298 A1    7/2003
WO      2008003603 A2    1/2008

OTHER PUBLICATIONS

PCT International Search Report, PCT/EP2017/063831, dated Aug. 18, 2017, 6 pages.

(Continued)

*Primary Examiner* — David E Smith (74) *Attorney, Agent, or Firm* — Edell, Shapiro & Finnan, LLC (57) ABSTRACT

An optical grating (8) includes a substrate (9), on the surface (9a) of which a periodic structure (10) is formed that is embodied to diffract incident radiation (11), in particular incident EUV radiation, with a specified wavelength ($\lambda_r$) into a predetermined order of diffraction, in particular into the first order of diffraction (m=+1). The optical grating also has a coating (12) applied onto the periodic structure with at least one layer (13, 14) that is embodied to suppress the diffraction of the incident radiation into at least one higher order of diffraction (m=+2, . . . ) than the predetermined order of diffraction.

22 Claims, 5 Drawing Sheets

(52) U.S. Cl.
CPC ...... *G03F 7/70316* (2013.01); *G03F 7/70575* (2013.01); *G03F 7/70958* (2013.01); *G21K 1/067* (2013.01)

(56) References Cited

U.S. PATENT DOCUMENTS

| | | | |
|---|---|---|---|
| 2003/0067687 A1 | 4/2003 | Barton et al. | |
| 2005/0030627 A1* | 2/2005 | Kleemann | G02B 5/1857 359/571 |
| 2005/0122589 A1* | 6/2005 | Bakker | G02B 1/11 359/591 |
| 2005/0236585 A1* | 10/2005 | Miyake | G03F 7/70033 250/492.2 |
| 2009/0059375 A1 | 3/2009 | Hoose | |
| 2013/0089117 A1 | 4/2013 | Sukegawa et al. | |

OTHER PUBLICATIONS

English translation of German Office Action, DE 10 2016 212 361.0, dated Mar. 1, 2017, 2 pages.

German Office Action, DE 10 2016 212 361.0, dated Mar. 1, 2017, 2 pages.

\* cited by examiner

OPTICAL GRATING AND OPTICAL ASSEMBLY FOR SAME

CROSS REFERENCE TO RELATED APPLICATION

This is a Continuation of International Application PCT/EP2017/063831, which has an international filing date of Jun. 7, 2017, and the disclosure of which is incorporated in its entirety into the present Continuation by reference. This Continuation also claims—foreign priority under 35 U.S.C. § 119(a)-(d) to German Patent Application DE 10 2016 212 361.0 filed Jul. 6, 2016, the entire contents of which are also incorporated into the present Continuation by reference.

FIELD OF THE INVENTION

The invention relates to an optical grating, comprising: a substrate, on the surface of which a periodic structure is formed, said structure being embodied to diffract incident radiation, in particular incident extreme ultraviolet (EUV) radiation, with a predetermined wavelength into a predetermined order of diffraction, in particular into the first order of diffraction. The invention also relates to an optical arrangement having such an optical grating.

BACKGROUND

The optical grating described here, more precisely the periodic structure thereof, typically has a so-called blaze structure in order to facilitate the diffraction of the incident radiation into a predetermined order of diffraction. A blaze structure or a blaze grating typically has a stepped embodiment and a respective structure has a substantially triangular cross section in the style of a sawtooth. The periodic structure in the form of the blaze structure is optimized in such a way that as much intensity of the incident radiation as possible is concentrated in a predetermined order of diffraction (typically in the 1st order of diffraction), while the intensity that is diffracted into the other orders of diffraction is ideally minimized. Since, typically, this can only be achieved exactly for a single predetermined wavelength, a blaze grating is characterized not only by the order of diffraction, for which the optical grating is optimized, but also by the predetermined wavelength (laser wavelength), which is diffracted into this order of diffraction.

By way of example, optical gratings with blaze structures can be used as monochromators for EUV radiation, i.e., for radiation at wavelengths between approximately 5 nm and approximately 35 nm. In this wavelength range, the optical grating is typically embodied as a reflective grating, which serves to select the predetermined wavelength from the incident radiation, i.e., the radiation reflected or diffracted at the optical grating ideally only has the predetermined wavelength, i.e., the latter is monochromatized. However, it is not possible, as a rule, to suppress all secondary orders in such optical gratings, and so there are unwanted radiation components at other wavelengths in the monochromatized EUV radiation, which can be traced back to the diffraction into higher orders of diffraction.

A further problem is presented by the polarizing effect during the reflection or diffraction at such an optical grating since the optical grating typically has different reflection properties for a polarization component perpendicular to a plane of incidence of the incident radiation (s-polarization) than for a polarization component parallel to a plane of incidence of the incident radiation (p-polarization). Even in the case of a possible total internal reflection, there is a polarization of the radiation reflected or diffracted at the optical grating.

DE 10 2015 203 572 A1 has disclosed an optical grating that has a periodic structure, which is formed by a superposition of a blaze structure and a periodic modification structure. The modification structure can have the same period as the blaze structure and therefore have a fixed phase relation to the blaze structure. This should bring about a suppression of the higher orders of diffraction in the light reflected by the blaze structure.

SUMMARY

It is an object of the invention to provide an optical grating and an optical arrangement having at least one such optical grating, in which the diffraction into higher orders of diffraction than in the predetermined order of diffraction is suppressed to the greatest possible extent.

This object is achieved by an optical grating of the type set forth at the outset, in which a coating is applied onto the periodic structure, said coating having at least one layer that is embodied to suppress the diffraction of the incident radiation into higher orders of diffraction than the predetermined order of diffraction.

In the case of conventional grating monochromators, the materials and the coatings possibly present there are typically selected with a view of maximizing the reflectivity or the diffraction into the predetermined order of diffraction. By contrast, the coating proposed here serves to suppress or minimize higher orders of diffraction in a targeted fashion while having the highest possible reflectivity of the grating for the predetermined wavelength. To this end, the coating proposed here has at least one (thin) layer. As a rule, the thickness of the entire coating is less than 1 µm. If the predetermined order of diffraction is the 1st order of diffraction, the wavelengths of the higher orders of diffraction are an integer fraction, i.e., half, a third, a quarter, . . . , of the 1st order of diffraction. Therefore, wavelength-dependent properties of the layer(s), typically of the materials of the layer(s), can be exploited to bring about the desired suppression of higher orders of diffraction.

In one embodiment, at least one layer of the coating is embodied as a total reflection layer with a critical angle, said critical angle being smaller than an angle of incidence of the incident radiation for the predetermined order of diffraction and being greater than the angle of incidence of the incident radiation for at least one higher order of diffraction. In this case, the total reflection layer serves to subject radiation incident at the predetermined wavelength to total internal reflection in order thereby to produce a maximum reflectivity for the predetermined wavelength while the critical angle is not reached for at least one higher order of diffraction, typically the next higher order of diffraction (e.g., corresponding to half, a third, a quarter, . . . , of the predetermined wavelength), and so these order(s) of diffraction or the wavelengths assigned to these orders of diffraction do not experience total internal reflection at the total reflection layer and therefore experience reflection with a very much lower reflectivity at the optical grating.

For the purposes of providing such a total reflection layer, it is possible to exploit that the following applies to the critical angle $\alpha_T$:

$$\alpha_T = \sqrt{2\delta(E)},$$

where $\delta(E)$ denotes the wavelength-dependent real part of the refractive index of the material of the total reflection layer. Therefore, the desired suppression of higher orders of diffraction can be implemented by the selection of a suitable material, in which, at shorter wavelengths than the predetermined wavelength, the real part of the refractive index, and consequently also the critical angle $\alpha_T$, significantly increases such that, at higher orders of diffraction, the critical angle $\alpha_T$ is greater than the angle of incidence while, at the predetermined wavelength, the critical angle is smaller than the angle of incidence.

The angle of incidence lies within a typically narrow operating angle range of the optical grating, which may have a width of, e.g., approximately 10° or less, for example. By way of example, the operating angle range can lie between a minimum angle of incidence of approximately 70°, 72° or 74° and a maximum angle of incidence of approximately 80° or approximately 78°.

In a development, the total reflection layer is formed from a material that has an absorption length of more than 10 nm, preferably of more than 50 nm, at the predetermined wavelength. The material of the total reflection layer should not absorb too strongly at the predetermined wavelength since there otherwise is strong damping of the total internal reflection and consequently a reduction in the reflectivity of the optical grating for the predetermined wavelength on account of the evanescent wave, i.e., the part of the E-field which penetrates into the material of the total reflection layer during total internal reflection. As the absorption length increases, i.e., the length that is required until the intensity of the radiation incident on the surface of the total reflection layer has fallen to 1/e, i.e., to approximately 63%, the absorption reduces.

In one advantageous development, the material of the total reflection layer is selected from the group comprising: Zr, Pd, C, Ru, Sn, Cd, Nb, Mo, and their compounds, in particular their alloys, carbides, nitrides, borides or silicides. For a predetermined wavelength, the materials specified here satisfy both the condition in relation to total internal reflection and the condition in relation to a comparatively low absorption at the predetermined wavelength. Zr, Pd, C, Nb, Mo and Ru, their alloys, carbides, nitrides, borides or silicides typically satisfy these two conditions for a predetermined wavelength between 13 nm and 16 nm, for example at approximately 13.5 nm, while Sn and Cd and the compounds thereof, in particular their alloys, carbides, nitrides, borides or silicides, satisfy these conditions at a wavelength between 6 nm and 8 nm, for example at approximately 6.5 nm.

In a further embodiment, at least one layer of the coating is embodied as an absorber layer, which has a greater absorption length for the predetermined order of diffraction than for at least one higher order of diffraction. The absorber layer should have as little absorption as possible for the predetermined order of diffraction, said absorption dropping as strongly as possible to higher orders of refraction (i.e., to shorter wavelengths); this can likewise be achieved by the selection of a suitable material for the absorber layer. In the case of higher orders of diffraction, this may relate, for example, to the next higher order of diffraction in relation to the predetermined order of diffraction. If the predetermined order of diffraction is the 1st order of diffraction, the higher order of diffraction can be, e.g., the 2nd order of diffraction, the wavelength of which corresponds to half the predetermined wavelength that should be reflected or diffracted at the optical grating.

Particularly in the case where the absorber layer forms the uppermost layer of the coating, the material of the absorber layer should be selected in such a way that it does not, where possible, degrade or oxidize in the surroundings in which the optical grating is arranged. It is understood that this condition should generally be satisfied by the uppermost layer of the coating, independently of whether this is an absorber layer.

In a further development, the absorber layer has a critical angle that is greater than the angle of incidence of the incident radiation for the predetermined order of diffraction; i.e., the absorber layer should not bring about total internal reflection of the incident radiation. This applies, in particular, to the case where the absorber layer is applied to a total reflection layer because the radiation otherwise cannot penetrate through, or can only penetrate through to a small extent, to the total reflection layer lying therebelow.

In one development, the material of the absorber layer is selected from the group comprising: Si, Mo, their carbides, nitrides, oxides, borides and $MoSi_2$. For at least one given wavelength in the EUV wavelength range, these materials each satisfy the above-described conditions in relation to the absorber layer. Si and its compounds, in particular its carbides, nitrides, oxides and borides typically satisfy these conditions for a wavelength between 13 nm and 16 nm, for example at approximately 13.5 nm, while Mo and its compounds, in particular its carbides, nitrides, oxides and borides, satisfies these conditions at a wavelength between 6 nm and 8 nm, for example at approximately 6.5 nm. It was found that the application of the absorber layer onto a total reflection layer or onto the periodic structure, for example made of SiC, can bring about significantly stronger suppression of the higher orders of diffraction than a wavelength filter, operated in transmission, made of the same material with an identical or possibly even greater thickness. The use of the absorber layer as part of the coating is consequently advantageous because, for the same damping of higher orders of diffraction, the thickness of such an absorber layer is less and hence the reflectivity for the predetermined wavelength is greater than when use is made of a wavelength filter operated in transmission.

In a further embodiment, the absorber layer is applied to the total reflection layer. The combination of total reflection layer and an absorber layer applied thereover was found to be particularly advantageous for the suppression of higher orders of diffraction. The absorption properties of the absorber layer for higher orders of diffraction are improved in relation to a conventional transmission filter made of an absorber layer with an identical thickness on account of the grazing incidence (total internal reflection). Moreover, destructive interference can be produced for higher orders of diffraction by way of a suitable selection of the layer thickness (see below).

In a further embodiment, the coating has at least one layer that is embodied to diffract incident radiation with a first polarization state perpendicular to a plane of incidence onto the optical grating (s-polarization) more strongly in the predetermined order of diffraction than incident radiation with a second polarization state (p-polarization) that is perpendicular to the first. This layer can be, in particular, the absorber layer described further above; i.e., the absorber layer can also serve to shift the polarization of the reflected radiation, or of the radiation scattered into the predetermined order of diffraction, more strongly in the direction to the s-polarization or to increase the ratio between the s-polarized radiation component and the p-polarized radiation component.

In a further embodiment, the coating has at least one layer, the thickness and material of which are selected in such a way that constructive interference occurs for the incident radiation in the predetermined order of diffraction and with the predetermined wavelength, and destructive interference occurs for at least one higher order of diffraction. In particular, the order of diffraction in which constructive interference occurs can be the 1st order of diffraction; by way of example, the 2nd order of diffraction can be the higher order of diffraction in which there is strong damping on account of the destructive interference. The layer whose thickness and material are suitably selected can be, for example, the absorber layer, which is applied to the total reflection layer.

In a further embodiment, the predetermined wavelength lies in a wavelength range between 13 nm and 16 nm, preferably at 13.5 nm. In currently operational EUV lithography systems, in particular in EUV lithography apparatuses, EUV radiation in this wavelength range is used as used or operating wavelength. Therefore, an optical grating in which the predetermined wavelength lies in this wavelength range can serve as a monochromator in order to filter out the used wavelength from the radiation that is emitted by an EUV radiation source in a typically comparatively broad wavelength band.

In one development, the coating has a total reflection layer made of Ru, Zr, Pd, Mo, Nb, their carbides, nitrides, oxides, borides and C and an absorber layer, applied to the layer of total internal reflection, made of Si, SiC, $Si_3N_4$, SiO, $SiO_2$. It was found that the above-described conditions or requirements in relation to such layer materials for the wavelength range between approximately 13 nm and approximately 16 nm, in particular at approximately 13.5 nm, and for a suitable angle of incidence or for a suitable operating angle of incidence range are satisfied both by Ru, Zr, Pd, Mo, Nb, their carbides, nitrides, oxides, borides and C as materials for the total reflection layer and by SiC and the further materials specified herein as material for the absorber layer.

In an alternative embodiment, the predetermined wavelength lies in a wavelength range between 6 nm and 8 nm, preferably at 6.5 nm. Future lithography systems for the EUV wavelength range may possibly be operated at shorter wavelengths, which, for example, may lie in the wavelength range specified here. An optical grating, in which the predetermined wavelength lies in the specified wavelength range, may therefore serve as a monochromator for filtering a corresponding used wavelength from a comparatively broad wavelength band of an EUV light source.

In one development, the coating has a total reflection layer made of Cd or Sn and an absorber layer made of Mo. For the wavelength range, specified above, between 6 nm and 8 nm, in particular at 6.5 mm, these materials meet the requirements specified further above in relation to the total reflection layer and in relation to the absorber layer.

Materials for layers that are embodied to suppress the diffraction of the incident radiation into higher orders of diffraction than into the predetermined order diffraction, for example into the first order diffraction, can also be found for other wavelength ranges than the two wavelength ranges described here. The optical grating with the desired properties can therefore also serve for a predetermined wavelength in the (soft) x-ray range or, optionally, in the VUV wavelength range at wavelengths of less than 250 nm.

In a further embodiment, the periodic structure comprises a blaze structure. As described further above, a blaze structure serves to focus the intensity of the incident radiation at a predetermined wavelength into a predetermined order of diffraction. The periodic structure may consist of a single blaze structure with, typically, a substantially triangular geometry and a single blaze angle; however, it is also possible for a periodic modification structure to be superimposed on the blaze structure, as is the case, for example, in DE 10 2015 203 572 A1, cited at the outset, which is incorporated in the subject matter of this application by reference. In particular, the periodic modification structure can have the same period length as the blaze structure.

In a further embodiment, the optical grating has a reflectivity of more than 50%, preferably more than 60%, in particular more than 70%, for incident radiation with the predetermined wavelength in the predetermined order of diffraction. As described further above, suitable selection of the materials and, optionally, the thicknesses of the layers of the coating not only allows effective suppression of diffraction into higher orders of diffraction in order thereby to reduce the contamination with other wavelengths of the radiation that is reflected or diffracted at the optical grating but, simultaneously, also allows the reflectivity of the grating in the case of diffraction into the predetermined order of diffraction to be kept at a comparatively high value.

A further aspect of the invention is realized in an optical arrangement, in particular an EUV lithography system, comprising: a light source for producing radiation, in particular for producing EUV radiation, and at least one optical grating, as described further above, for diffracting radiation of the light source at the predetermined wavelength into the predetermined order of diffraction. In this case, the optical grating typically serves as a monochromator for the radiation of the light source, emitted in broadband fashion, in order to select the used wavelength from the spectrum of the light source.

For the purposes of this application, an EUV lithography system is understood as meaning an optical system that can be used in the field of EUV lithography. Apart from an EUV lithography apparatus, which serves for the production of semiconductor components, the optical system may be for example an inspection system for the inspection of a photomask used in an EUV lithography apparatus (hereinafter also referred to as a reticle), for the inspection of a semiconductor substrate to be structured (hereinafter also referred to as a wafer) or a metrology system, which is used for measuring an EUV lithography apparatus or parts thereof, for example for measuring a projection system.

In one embodiment, the optical arrangement is embodied in such a way that the incident radiation is incident on the optical grating at at least one angle of incidence in an angle of incidence range between 70° and 90°, preferably between 72° and 78°, in particular between 74° and 76°, or between 80° and 88°, preferably between 82° and 86°. To this end, the optical grating is suitably aligned in relation to the incident radiation, typically in relation to the light source. Optionally, the incident radiation can also be incident on the optical grating in a smaller angle of incidence range, for example restricted to between approximately 74° and approximately 76° or between 82° and 86°. Optionally, the angle of incident range can be modified to a certain extent by way of a relative movement between the optical grating and the incident radiation, for example by way of tilting the optical grating. As a rule, as the angle of incidence used increases, the predetermined wavelength becomes smaller.

As is generally conventional, the angle of incidence is measured in relation to the surface normal of the surface of the substrate of the optical grating that, as a rule, is planar. As described further above, the use of the optical grating with the properties described further above as a monochromator can prevent the contamination with other wavelengths of the radiation diffracted into the predetermined order of diffraction, without this causing a significant reduction in the reflectivity of the optical grating for the incident radiation with the predetermined wavelength or the used wavelength. Optionally, the optical grating can also be used for other purposes than the monochromatization of incident radiation.

Further features and advantages of the invention emerge from the following description of exemplary embodiments of the invention, with reference to the figures of the drawing, which show details essential to the invention, and from the claims. The individual features may be realized in each case individually by themselves or as a plurality in any desired combination in a variant of the invention.

BRIEF DESCRIPTION OF THE DRAWINGS

Exemplary embodiments are represented in the schematic drawing and are explained in the following description. In the drawing.

DETAILED DESCRIPTION

Figure 1:
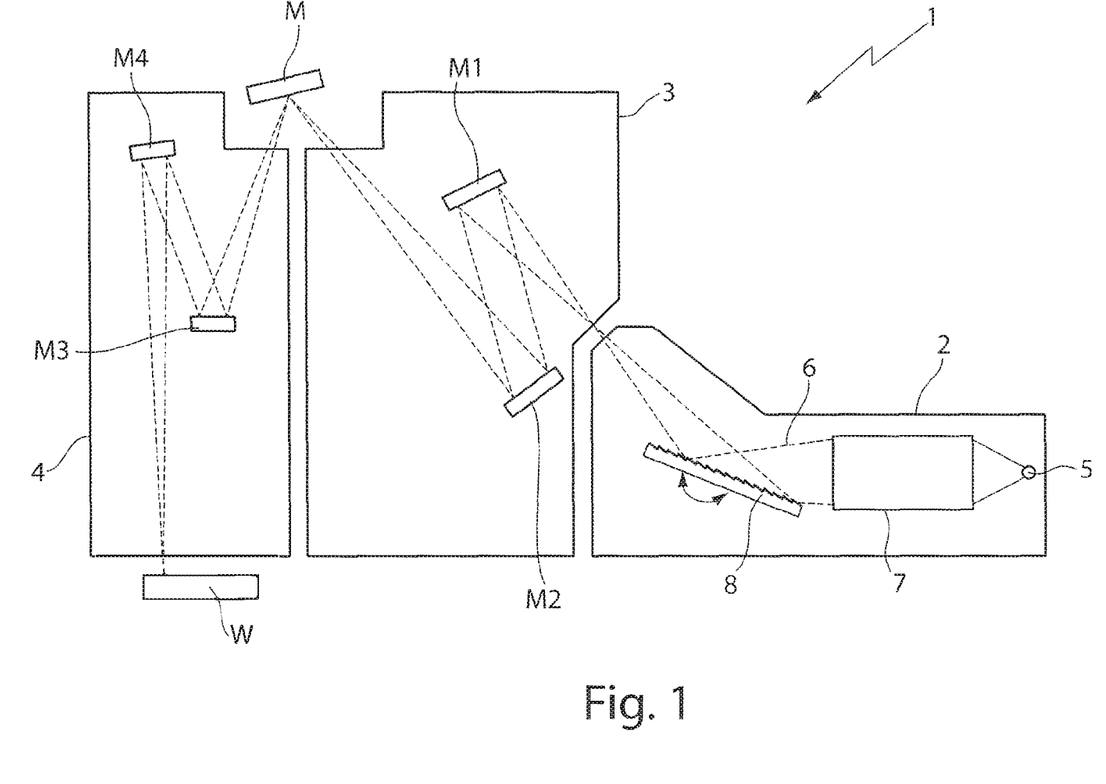
FIG. 1 shows a schematic illustration of an EUV lithography apparatus having a monochromator in the form of an optical grating.

FIG. 1 shows a schematic view of an EUV lithography system in the form of an EUV lithography apparatus 1 which consists of a beam-shaping system 2, an illumination system 3 and a projection system 4, which are accommodated in separate vacuum housings and are arranged in succession in a beam path 6 proceeding from an EUV light source 5 of the beam-shaping system 2. A plasma source or a synchrotron can serve for example as the EUV light source 5. The radiation emerging from the EUV light source 5 in the wavelength range between about 5 nm and about 20 nm is first focused in a collimator 7. The desired used wavelength $\lambda_T$ can be filtered out with the aid of a downstream monochromator in the form of an optical grating 8. Optionally, the angle of incidence range can be varied in the process, as indicated by a double-headed arrow. In the EUV wavelength range, the collimator 7 and the monochromator 8 are usually formed as reflective optical elements.

The EUV radiation at the used wavelength $\lambda_T$, which is manipulated in the beam-shaping system 2 with regard to wavelength and spatial distribution, is introduced into the illumination system 3, which has a first and a second reflective optical element M1, M2. The two reflective optical elements M1, M2 guide the radiation onto a photomask M as a further reflective optical element, which has a structure that is imaged with the projection system 4 onto a wafer W on a reduced scale. To this end, a third and a fourth reflective optical element M3, M4 are provided in the projection system 4. The reflective optical elements M1 to M4, M respectively have an optical surface, which are arranged in the beam path 6 of the EUV lithography apparatus 1.

The monochromator of the EUV lithography system 1 of FIG. 1 is embodied as an optical grating 8, which is described in more detail below on the basis of FIG. 2.

Figure 2:
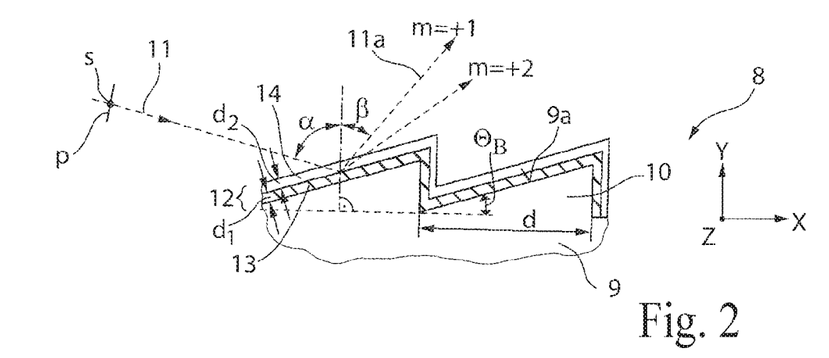
FIG. 2 shows a schematic illustration of a detail of the optical grating with a coating having a total reflection layer and an absorber layer.

As may be seenseen in FIG. 2, the optical grating 8 has a substrate 9 made of quartz glass in the shown example. It is understood that the substrate 9 can also be formed from a different material, e.g., a glass ceramic or doped quartz glass. A periodic structure in the form of a blaze structure 10 with steps that are triangular in cross section is formed on the surface 9a of the substrate 9, said blaze structure having a period length or a grating spacing d and a blaze angle $\theta_B$ at which the steps are inclined in relation to the horizontal, illustrated using dashed lines in FIG. 2, along which the substrate 9 or the optical grating 8 extends.

The general grating equation, as set forth below, applies to the blaze structure:

$$d \times (\sin(\alpha) + \sin((\beta_m)) = m\, \lambda_T,$$

where $\alpha$ denotes the angle of incidence and $\beta_m$ denotes the angle of emergence of incident radiation 11 and m denotes the order of diffraction, and $\lambda_T$ denotes the used wavelength or a predetermined wavelength, for which the blaze structure 10 is optimized. The angle of emergence $\beta$, shown in FIG. 2, in this case denotes the angle of emergence of the first order of diffraction (actually $\beta_1$, i.e., m=+1). For higher orders of diffraction, m=+2, m=+3, etc., the corresponding angles of emergence, $\beta_2$, $\beta_3$, etc., not shown in FIG. 2, increase.

The blaze structure 10, i.e., in particular, the grating constant d and the blaze angle $\theta_B$, are optimized for the predetermined wavelength kr and a predetermined angle of incidence range in such a way that the intensity of the incident radiation 11 is concentrated in exactly one order of diffraction, the first order of diffraction (m=+1) in the shown example, while the diffraction into the higher orders of diffraction (m=+2, m=+3, . . . ), at which the diffracted radiation has wavelengths that lie at integer fractions 1/m of the predetermined wavelength $\lambda_T$, should be minimized.

However, the diffraction of radiation 11 incident on the optical grating 8 cannot be suppressed completely for all higher orders of diffraction m=+2, m=+3, . . . with the aid of the blaze structure 10. Therefore, there may be unwanted wavelength components in the radiation 11a that is diffracted or reflected at the optical grating 8, said unwanted wavelength components deviating from the predetermined wavelength kr, and so the radiation 11a that is reflected or diffracted at the optical grating 8 is not completely monochromatized.

In the example shown in FIG. 2, a coating 12 has been applied onto the substrate 9 of the optical grating 8, more precisely onto the blaze structure 10, said coating consisting of a total reflection layer 13 and an absorber layer 14 applied to the total reflection layer 13, both layers serving to suppress the diffraction of incident radiation 11 at the optical grating 8 into orders of diffraction that are higher than the 1st order of diffraction (m=+1), as will be described in more detail below. The type of material of the total reflection layer 13 and of the absorber layer 14 depends on the predetermined wavelength $\lambda_T$, for which the optical grating 8 is optimized.

As mentioned further above, the used wavelength $\lambda_T$ of the EUV lithography apparatus 1, which corresponds to the predetermined wavelength $\lambda_T$, is 13.5 nm in the shown example. As described below on the basis of FIGS. 3A and 3B and FIGS. 4A and 4B, ZrN can be used as material for the total reflection layer 13 for this predetermined wavelength $\lambda_T$, more precisely for a predetermined wavelength $\lambda_T$ that lies in an operating wavelength range $\Delta\lambda_1$ between approximately 13 nm and 16 nm.

Figure 3A:
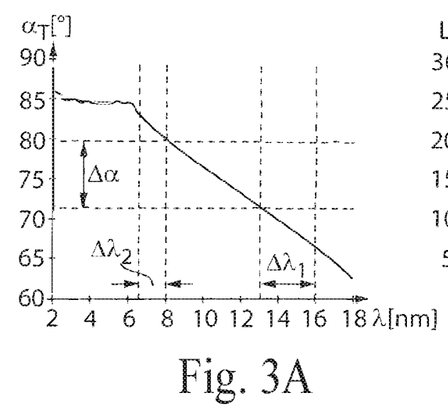
FIGS. 3A and 3B show schematic illustrations of the critical angle and the absorption length of ZrN, as a material of the total reflection layer, as a function of the wavelength.

FIG. 3A shows the critical angle $\alpha_T$ of ZrN as a function of the wavelength $\lambda$ for a wavelength range between approximately 2 nm and approximately 18 nm. As may be seeseen in FIG. 3A, the critical angle $\alpha_T$ increases to shorter wavelengths, wherein the critical angle $\alpha_T$ in the operating wavelength range $\Delta\lambda_1$ is less than the angle of incidence $\alpha$ of the incident radiation 11, and so ZrN acts as a total reflection layer 13 for the 1st order of diffraction or for a predetermined wavelength $\lambda_T$, which lies in the operating wavelength range $\Delta\lambda_1$. For the purposes of suppressing the 2nd order of diffraction, which corresponds to a wavelength range $\Delta\lambda_2$ between 6.5 nm and 8 nm, the critical angle $\alpha_T$ should be greater than the angle of incidence $\alpha$ so that no total internal reflection of the 2nd order of diffraction occurs at the total reflection layer 13. As may be seen in FIG. 3A, this condition is satisfied for an operating angle of incidence range $\Delta\alpha$ between a minimum angle of incidence of approximately 72° and a maximum angle of incidence of approximately 80°. Consequently, the total reflection layer 13 made of ZrN suppresses the diffraction of the incident radiation 11 into the 2nd order diffraction for incident radiation 11 with an angle of incidence $\alpha$ that lies between the minimum angle of incidence $\alpha_{MIN}$ and the maximum angle of incidence $\alpha_{MAX}$ of the operating angle of incidence range $\Delta\alpha$ and which has a predetermined wavelength $\lambda_T$ that lies in the operating wavelength range $\Delta\lambda_1$.

Figure 3B:
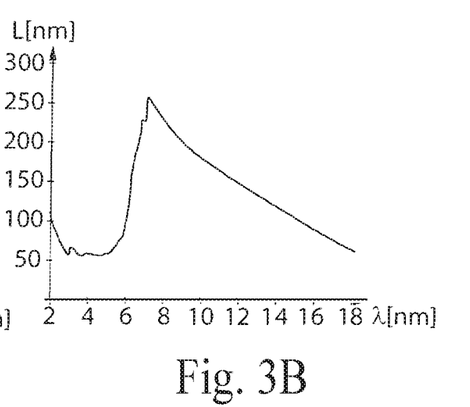
Figure 4A:
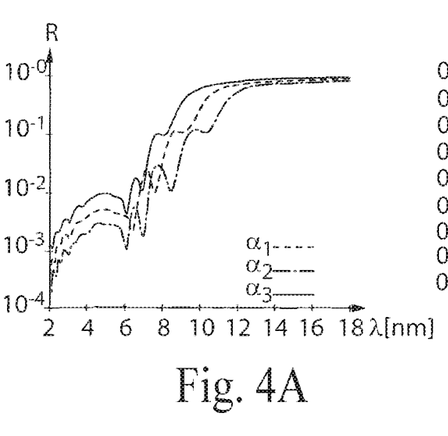
FIGS. 4A and 4B show schematic illustrations of the reflectivity of an optical grating with a total reflection layer in the form of ZrN as a function of the wavelength, using a logarithmic and a linear scale.
Figure 4B:
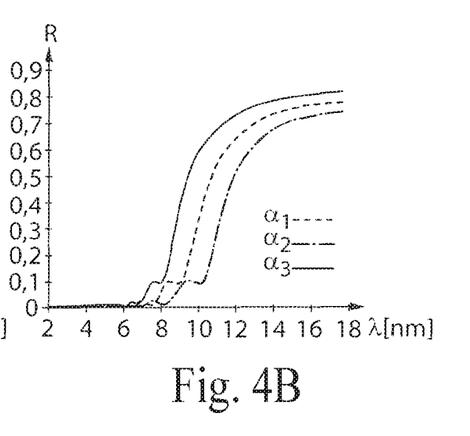

FIG. 3B shows the absorption length L in nm, i.e., the length at which the intensity of radiation penetrating into the ZrN material has dropped to 1/e, i.e., to approximately 63% of the intensity at the surface of the ZrN material. As may be seen in FIG. 3B, the absorption length for the predetermined wavelength $\lambda_T$ or for the entire operating wavelength range $\Delta\lambda_1$ between approximately 13 nm and approximately 16 nm lies at more than 50 nm, i.e., the absorption of the total reflection layer 13 is comparatively low. Accordingly, the reflectivity R as a function of the wavelength $\lambda$ for the wavelengths, relevant here, between 2 nm and 18 nm, shown in FIGS. 4A and 4B, emerges for three angles of incidence $\alpha_1$=76°, $\alpha_2$=74°, $\alpha_3$=78° from the operating angle of incidence range. As emerges from FIG. 4B in particular, the reflectivity R of the total reflection layer 13 is more than approximately 50%, even more than approximately 70% for the third angle of incidence $\alpha_3$ of approximately 78°, in the case of wavelengths in the operating wavelength range between 13 nm and 16 nm, in particular at 13.5 nm.

Figure 5A:
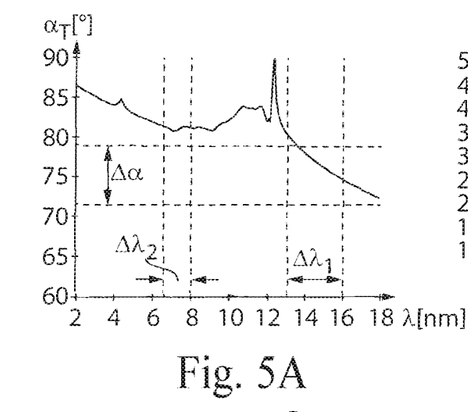
FIGS. 5A and 5B show schematic illustrations of the critical angle and the absorption length of SiC, as a material of the absorber layer, as a function of the wavelength.

In the example described here, in which the operating wavelength range lies between 13 nm and 16 nm, the absorber layer 14 is formed from SiC. The absorber layer 14 made out of this material likewise renders it possible to suppress higher orders of diffraction m=+2, m=+3, . . . , as will be described below on the basis of FIGS. 5A and 5B, which, in a manner analogous to FIGS. 3A, 3B, show the critical angle $\alpha_T$ and the absorption length L of SiC. As may be seen from FIG. 5A, the critical angle $\alpha_T$ lies at more than approximately 80° for a predetermined wavelength of approximately 13 nm or $\lambda_T$=13.5 nm, and consequently it is greater than the angle of incidence $\alpha$ in an operating angle of incidence range $\Delta\alpha$ of the optical grating 8 between approximately 72° and approximately 78°. This also applies to half the predetermined wavelength $\lambda_T$ of approximately 6.5 nm or 6.75 nm, i.e., the absorber layer 14 is not totally reflective for the incident radiation 11 in the case of both the 1st order of diffraction and the 2nd order of diffraction.

Figure 5B:
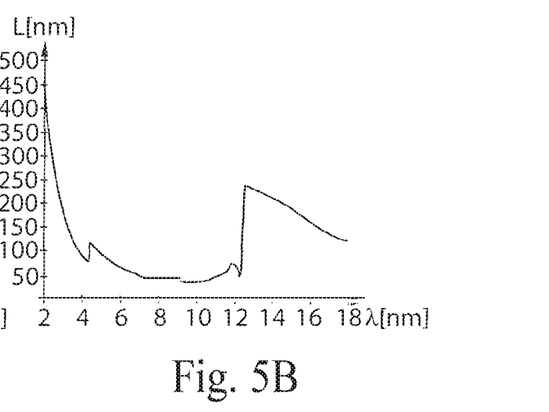

As may be seen in FIG. 5B, the absorption length L is long (absorption length between approximately 240 nm and approximately 270 nm) for the operating wavelength range $\Delta\lambda_1$ between approximately 13 nm and approximately 16 nm, while the absorption length L is smaller by approximately a factor of 4 (absorption length between approximately 40 nm and approximately 60 nm) in the wavelength range $\Delta\lambda_2$ with the half wavelengths of the operating wavelength range $\Delta\lambda_2$, between approximately 6.5 nm and approximately 8 nm. Consequently, the absorption of the absorber layer 14 for incident radiation 11 diffracted into the 2nd order of diffraction is approximately four times as large as for incident radiation 11 diffracted into the 1st order of diffraction.

Figure 6:
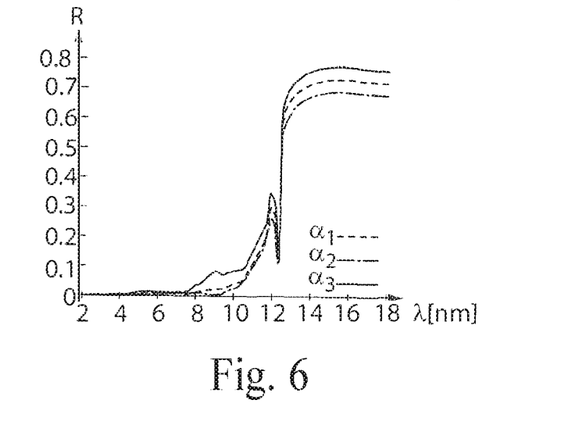
FIG. 6 shows a schematic illustration of the reflectivity of an optical grating with a total reflection layer made of Ru and an absorber layer made of SiC as a function of the wavelength.

Despite the presence of the absorber layer 14, the reflectivity R of the optical grating 8, or the diffraction efficiency thereof, is not reduced significantly, as may be seen on the basis of FIG. 6, which shows the reflectivity R of an absorber layer made of SiC with a thickness $d_2$ (see FIG. 2) of approximately 7.5 nm on a total reflection layer 13 made of ruthenium with a thickness $d_1$ of approximately 30 nm, which likewise satisfies the above-described requirements on the total reflection layer 13 for the operating wavelength range between approximately 13 nm and approximately 16 nm.

As may be seen from FIG. 6, the reflectivity R for the wavelength range of the 2nd order of diffraction, i.e., between 6.5 nm and 8 nm, is damped by approximately a factor of 60 in relation to the operating wavelength range between 13 nm and 16 nm, in which the reflectivity R is more than approximately 60%.

Figure 7A:
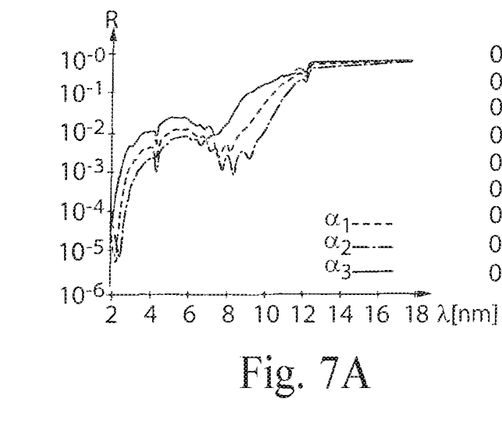
FIGS. 7A and 7B show schematic illustrations of the reflectivity of an optical grating with a total reflection layer made of ZrN and an absorber layer made of SiC as a function of the wavelength with a logarithmic and with a linear scale.
Figure 7B:
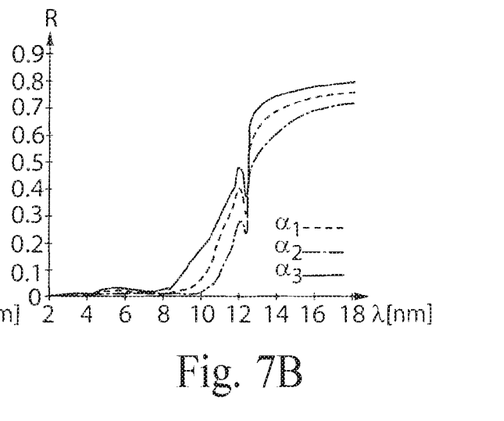

FIGS. 7A and 7B show the reflectivity R of an optical grating 8, which has a coating 12 made of a total reflection layer 13 made of ZrN with a thickness $d_1$ of approximately 100 nm and an absorber layer 14, applied thereon, made of SiC with a thickness $d_2$ of approximately 3.0 nm. As emerges from a comparison with FIG. 6, the optical grating 8 with the coating 12 of FIGS. 7A and 7B has an even better performance, i.e. a stronger suppression of the 2nd order of diffraction at wavelengths between approximately 6.5 nm and approximately 8 nm and also higher reflectivity R in the operating wavelength range between approximately 13 nm and approximately 16 nm, which lies at more than approximately 75% for the third angle $\alpha_3$.

Figure 8A:
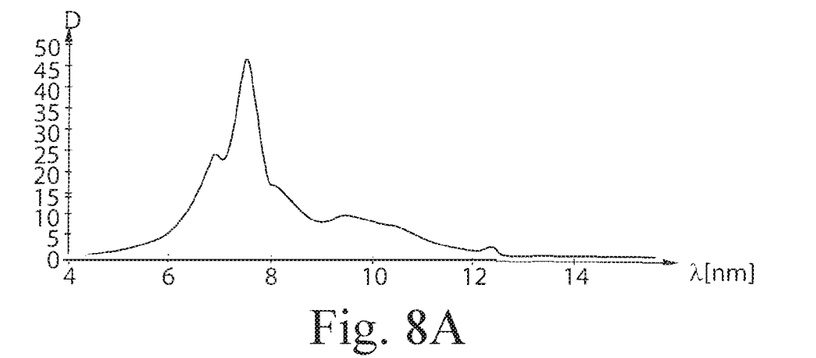
FIGS. 8A and 8B show schematic illustrations of the damping of the absorber layer made of SiC and of a transmission filter made of SiC, as a function of the wavelength.
Figure 8B:
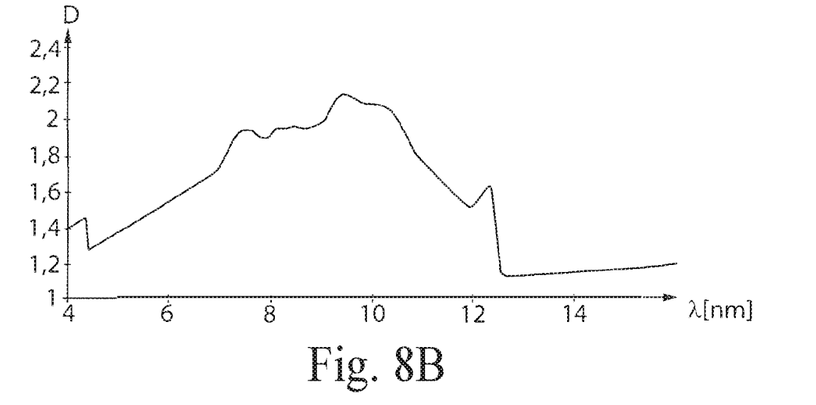
Figure 9A:
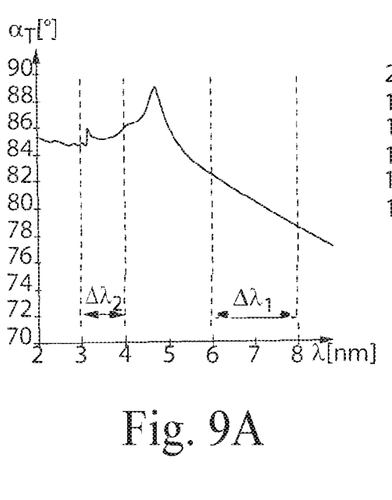
FIGS. 9A and 9B show schematic illustrations of the critical angle and the absorption length of Mo, as a material of the absorber layer, as a function of the wavelength.
Figure 9B:
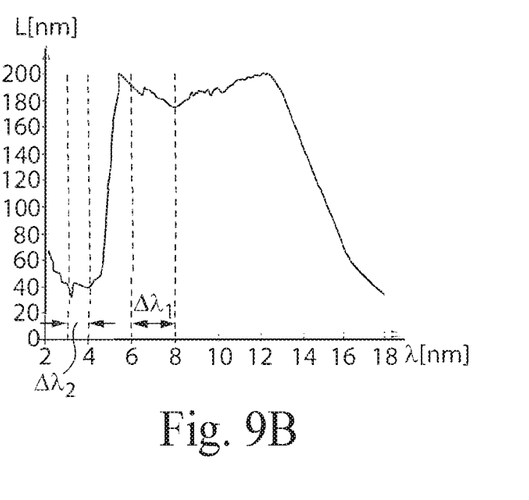

FIG. 8A shows the damping D, i.e., the ratio between the reflectivity of the optical grating 8 with the absorber layer 14 made of SiC with a thickness $d_2$ of 7 nm in relation to the reflectivity without such an absorber layer 14. As may be seen in FIG. 8A, the absorber layer 14 produces a damping D between a factor of 15 and a factor of 45 in the second wavelength range $\Delta\lambda_2$ between approximately 6.5 nm and approximately 8 nm, i.e., the suppression of the second order of diffraction is significantly increased by the absorber layer 14 for the angle of incidence α of 77.5° chosen in this case. In contrast thereto, the damping D in the second wavelength range $\Delta\lambda_2$ is significantly lower, and does not even reach a factor of 2.0, in the case of a transmission filter, shown in FIG. 8B, in the form of SiC with a thickness of approximately 30 nm. Therefore, the absorber layer 14 is substantially more effective for suppressing the diffraction into the 2nd order of diffraction when compared to a transmissive wavelength filter.

The absorber layer 14 made of SiC is also embodied to diffract incident radiation 11 with a first polarization state (s-polarization) perpendicular to a plane of incidence X, Y (see FIG. 2) onto the optical grating 8 more strongly in the predetermined order of diffraction m=+1 than incident radiation 11 with a second polarization state (p-polarization) that is perpendicular to the first.

The polarizing effect of the absorber layer 14 can be modified by the thickness $d_2$ thereof, as emerges from the following table 1, which was calculated for the second angle of incidence $\alpha_2$ of 76° in the case of a predetermined wavelength $\lambda_T$ of 13.5 nm:

TABLE 1

| | SiC thickness $d_2$ | | | |
|---|---|---|---|---|
| | 2 nm | 3 nm | 4 nm | 6 nm |
| s/p-ratio | 1.033 | 1.031 | 1.029 | 1.025 |

Consequently, the polarizing effect of the optical grating 8 can be modified by approximately 0.8% for the variation of the thickness $d_2$ of the absorber layer 14 between 2 nm and 6 nm. It is understood that a polarizing layer, which has no effect, or only negligible effect, on the absorption of the 1st order of diffraction or the 2nd order of diffraction, can be used instead of an absorber layer 14 for the purposes of producing this effect. Optionally, the coating 12 can have only one such polarizing layer or consist of such a polarizing layer. Instead of SiC, the absorber layer 14 may also be formed from another silicon-containing material, for example Si, $Si_3N_4$, SiO, $SiO_2$.

In a manner analogous to FIGS. 5A and 5B, FIGS. 9A and 9B show the critical angle $\alpha_T$ and the absorption length L of Mo as a function of the wavelength λ between 2 nm and 10 nm and between 2 nm and 18 nm, respectively. As may be seen from FIG. 9A, the critical angle $\alpha_T$ in the case of a predetermined wavelength $\lambda_T$ of approximately 6.5 nm lies at more than 80° and it is therefore greater than the angles of incidence of the radiation 11 incident on the optical grating 8, said angles of incidence typically likewise lying in an operating angle of incidence range Δα between approximately 70° and 80°, in particular between approximately 74° and approximately 78°. As may be seen in FIG. 9B, the absorption length L in the operating wavelength range between approximately 6 nm and approximately 8 nm is greater than the wavelengths of the 2nd order of diffraction between 3 nm and 4 nm by approximately a factor of 4.5.

Figure 10A:
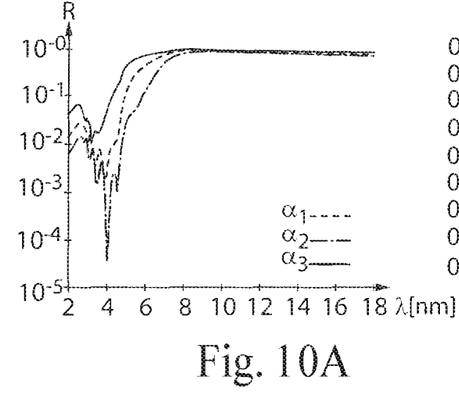
FIGS. 10A and 10B show schematic illustrations of the reflectivity of an optical grating with a total reflection layer made of Cd and an absorber layer made of Mo as a function of the wavelength in a logarithmic and in a linear scale.
Figure 10B:
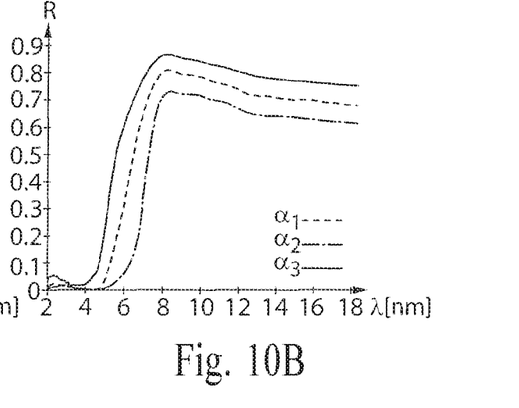

While the examples of an optical grating 8 and of the coating 12, described further above, are each optimized for an operating wavelength range between 13 nm and 16 nm, e.g., at approximately 13.5 nm, FIGS. 10A and 10B show an example of a coating 12 which is optimized for an operating wavelength range $\Delta\lambda_1$ between approximately 6 nm and approximately 8 nm. The coating 12 has a total reflection layer 13 made of Cd and an absorber layer 14 made of Mo with a layer thickness of $d_2$=1.5 nm. FIGS. 10A and 10B illustrate the reflectivity R of the coating 12 for three angles of incidence $\alpha_1$=82°, $\alpha_2$=80°, $\alpha_3$=84° from an operating angle of incidence range between 80° and 90°, as a function of the wavelength λ. As may be seen from FIG. 10B in particular, the reflectivity R is more than approximately 50% both in the case of the first angle of incidence $\alpha_1$ and in the case of the third angle of incidence $\alpha_3$ for the operating wavelength range $\Delta\lambda_1$ and it is significantly reduced for the wavelength range of the 2nd order of diffraction, i.e., between 3 nm and a 4 nm.

Figure 11A:
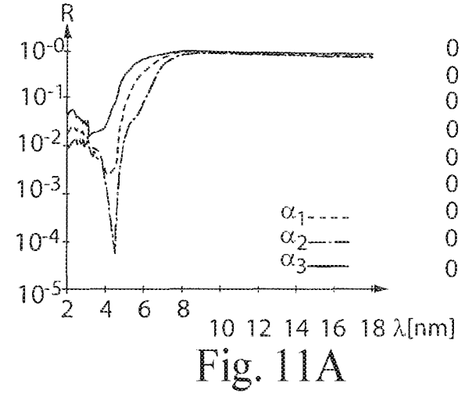
FIGS. 11A and 11B show schematic illustrations of the reflectivity of an optical grating with a total reflection layer made of Sn and an absorber layer made of Mo as a function of the wavelength in a logarithmic and in a linear scale.
Figure 11B:
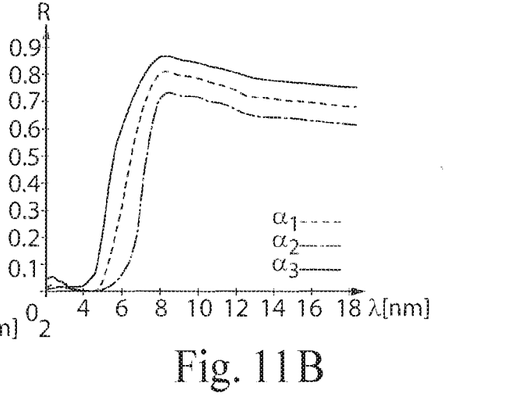

In a manner analogous to FIGS. 10A and 10B, FIGS. 11A and 11B show an example of a coating 12 which is optimized for an operating wavelength range $\Delta\lambda_1$ between approximately 6 nm and approximately 8 nm. The coating 12 has a total reflection layer 13 made of Sn with a thickness $d_1$=100 nm and an absorber layer 14 made of Mo with a thickness of $d_2$=2.0 nm. As may be seen on the basis of comparison between FIGS. 10A and 10B and FIGS. 11A and 11B, the reflectivity R, and hence the suppression of the 2nd order of diffraction, for the coating 12 described in conjunction with FIGS. 11A and 11B is similar to that of the coating 12 described in conjunction with FIGS. 10A and 10B, i.e., both coatings 12 have a great suppression of the 2nd order of diffraction with, at the same time, a high reflectivity R in the case of the 1st order of diffraction.

The thickness $d_2$ of the absorber layer 14 and the material thereof can be selected in such a way that constructive interference occurs for the incident radiation 11 with the predetermined wavelength $\lambda_L$ in the predetermined 1st order of diffraction m=+1 and destructive interference, i.e., minimum reflectivity, occurs at least for the 2nd order of diffraction m=+2, as a result of which the 2nd order of diffraction can likewise be effectively suppressed.

Figure 12:
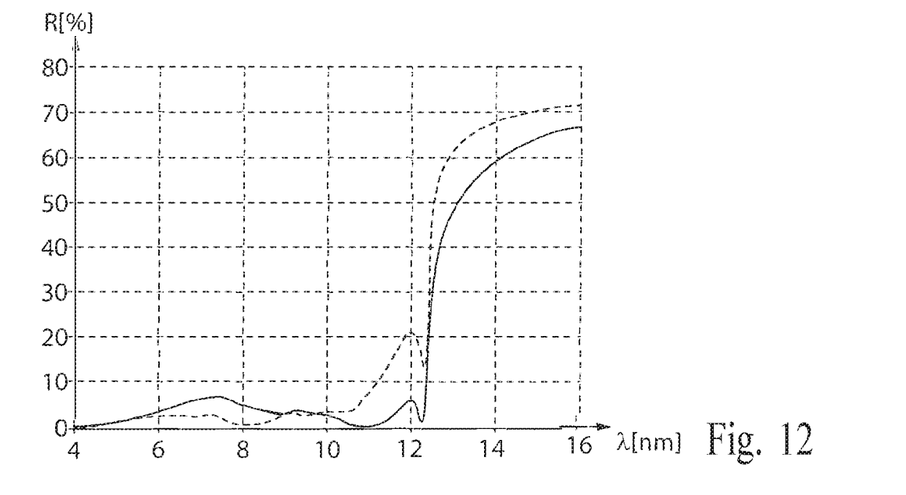
FIG. 12 shows a schematic illustration of the reflectivity of an absorber layer made of SiC in the case of two different layer thicknesses.

FIG. 12 shows the reflectivity R for an absorber layer 14 made of SiC in the case of a thickness $d_2$ of 9 nm (dashed line) and in the case of a thickness $d_2$ of 13 nm (solid line). In the case where the absorber layer 14 has a thickness $d_2$ of 9 nm, the minimum of the reflectivity R lies at a wavelength λ of approximately 8 nm, while the minimum of the reflectivity R lies at a wavelength of approximately 11 nm in the case of the thickness $d_2$ of 13 nm. Consequently, a suitable choice of the thickness $d_2$ of the absorber layer 14 allows the position of the minimum of the reflectivity R to be shifted to the wavelength λ at which the 2nd order of diffraction should be maximally suppressed. Optionally, this effect can be achieved by one or possibly two or more layers with suitable materials and thicknesses, which do not meet the requirements, described further above, in respect of the total reflection layer 13 and in respect of the absorber layer 14.

In place of a total reflection layer 13 made of one of the materials specified further above, the total reflection layer 13 can also be formed by a chemical compound, for example an alloy, a carbide, nitride, oxide, boride or silicide, which meets the requirements described further above. The same applies to the absorber layer 14, which may likewise be formed from a carbide, nitride, oxide, boride of Si or C or, for example, from $MoSi_2$.

Even though the subject matter of the examples above relates to an optical grating 8 for radiation in the EUV wavelength range, the optical grating 8, and consequently also the materials of the coating 12, can be optimized for predetermined wavelengths $\lambda_T$ in other wavelength ranges, for example for shorter wavelengths in the x-ray range or for longer wavelengths in the VUV wavelength range of up to approximately 250 nm. In wavelength ranges with longer wavelengths than in the EUV wavelength range, an optical grating 8 operated in transmission may possibly also be used in place of an optical grating 8 operated in reflection.

What is claimed is:

1. An optical grating, comprising:
    a substrate having a surface with a periodic structure, wherein the structure is embodied to diffract incident radiation with a predetermined wavelength ($\lambda_T$) into a predetermined order of diffraction, and
    a coating applied onto the periodic structure, wherein the coating has at least one layer that is embodied to suppress the diffraction of the incident radiation into at least one higher order of diffraction than the predetermined order of diffraction,
    wherein at least one layer of the coating is embodied as a total reflection layer with a critical angle ($\alpha_T$), wherein the critical angle is smaller than an angle of incidence ($\alpha$) of the incident radiation for the predetermined order of diffraction and is greater than the angle of incidence ($\alpha$) of the incident radiation for at least one higher order of diffraction.

2. The optical grating as claimed in claim 1, wherein the structure is embodied to diffract extreme ultraviolet (EUV) radiation with the predetermined wavelength ($\lambda_T$) into the predetermined order of diffraction.

3. The optical grating as claimed in claim 1, wherein the structure is embodied to diffract the incident radiation with the predetermined wavelength ($\lambda_T$) into the first order of diffraction.

4. The optical grating as claimed in claim 1, wherein the total reflection layer is formed from a material that has an absorption length of more than 10 nm at the predetermined wavelength ($\lambda_T$).

5. The optical grating as claimed in claim 4, wherein the total reflection layer is formed from a material that has an absorption length of more than 50 nm at the predetermined wavelength ($\lambda_T$).

6. The optical grating as claimed in claim 4, wherein the material of the total reflection layer is selected from the group consisting of: Zr, Pd, C, Ru, Mo, Nb, Sn, Cd, or alloys, carbides, nitrides, oxides, borides or silicides thereof.

7. The optical grating as claimed in claim 1, wherein at least one layer of the coating is embodied as an absorber layer which has a greater absorption length for the predetermined order of diffraction than for at least one higher order of diffraction.

8. The optical grating as claimed in claim 7, wherein the absorber layer has a critical angle ($\alpha_T$) that is greater than an angle of incidence ($\alpha$) of the incident radiation for the predetermined order of diffraction.

9. The optical grating as claimed in claim 7, wherein the material of the absorber layer is selected from the group consisting of: Si, Mo, or carbides, nitrides, oxides, or borides thereof, and $MoSi_2$.

10. The optical grating as claimed in claim 7, wherein the absorber layer is applied onto the total reflection layer.

11. The optical grating as claimed in claim 1, wherein the coating has at least one layer that is embodied to diffract incident radiation with a first polarization state perpendicular to a plane of incidence onto the optical grating more strongly in the predetermined order of diffraction than incident radiation with a second polarization state that is perpendicular to the incident radiation with the first polarization state.

12. The optical grating as claimed in claim 1, wherein the coating has at least one layer a thickness ($d_2$) and a material of which are selected such that constructive interference occurs for the incident radiation with the predetermined wavelength ($\lambda_L$) in the predetermined order of diffraction and destructive interference occurs for at least one higher order of diffraction.

13. The optical grating as claimed in claim 1, wherein the predetermined wavelength ($\lambda_T$) lies in a wavelength range between 13 nm and 16 nm.

14. The optical grating as claimed in claim 13, wherein the coating has a total reflection layer made of Ru, Zr, Pd, Nb, Mo, or alloys, carbides, nitrides, oxides, borides, or silicides thereof, or C, and an absorber layer, applied to the layer of total internal reflection, made of Si, SiC, $Si_3N_4$, SiO, or $SiO_2$.

15. The optical grating as claimed in claim 1, wherein the predetermined wavelength ($\lambda_T$) lies in a wavelength range between 6 nm and 8 nm.

16. The optical grating as claimed in claim 15, wherein the coating has a total reflection layer made of Cd or Sn and an absorber layer made of Mo.

17. The optical grating as claimed in claim 1, wherein the periodic structure comprises a blaze structure.

18. The optical grating as claimed in claim 1, having a reflectivity of more than 50% for incident radiation with the predetermined wavelength ($\lambda_T$) in the predetermined order of diffraction.

19. An optical arrangement, comprising:
    a light source configured to produce radiation and
    at least one optical grating as claimed in claim 1 and arranged to diffract the radiation of the light source with the predetermined wavelength ($\lambda_T$) into the predetermined order of diffraction.

20. The optical arrangement as claimed in claim 19, configured as an EUV lithography system, wherein the light source is configured to produce EUV radiation.

21. The optical arrangement as claimed in claim 19, wherein the incident radiation is incident on the optical grating at at least one angle of incidence ($\alpha$) in an angle of incidence range ($\Delta\alpha$) between 70° and 90°.

22. An optical grating, comprising:
    a substrate having a surface with a periodic structure, wherein the structure is embodied to diffract incident radiation with a predetermined wavelength ($\lambda_T$) into a predetermined order of diffraction, and
    a coating applied onto the periodic structure, wherein the coating has at least one layer that is embodied to suppress the diffraction of the incident radiation into at least one higher order of diffraction than the predetermined order of diffraction,
    wherein the coating has at least one layer that is embodied to diffract incident radiation with a first polarization state perpendicular to a plane of incidence onto the optical grating more strongly in the predetermined order of diffraction than incident radiation with a second polarization state that is perpendicular to the incident radiation with the first polarization state.

* * * * *

UNITED STATES PATENT AND TRADEMARK OFFICE
CERTIFICATE OF CORRECTION

PATENT NO. : 10,578,783 B2
APPLICATION NO. : 16/239045
DATED : March 3, 2020
INVENTOR(S) : Sebastian Brueck et al.

Page 1 of 1

It is certified that error appears in the above-identified patent and that said Letters Patent is hereby corrected as shown below:

In the Specification

In Column 8, Line 28, delete "seenseen" and insert -- seen --, therefor.

In Column 8, Line 41, delete "d×(sin(α)+sin((β$_m$))=m λ$_T$," and insert -- d×(sin(α)+sin(β$_m$))=m λ$_T$, --, therefor.

In Column 8, Line 55, delete "Kr" and insert -- λ$_T$ --, therefor.

In Column 9, Line 3, delete "Kr," and insert -- λ$_T$, --, therefor.

In Column 9, Line 30, delete "seenseen" and insert -- seen --, therefor.

Signed and Sealed this
Eighth Day of December, 2020

Andrei Iancu
*Director of the United States Patent and Trademark Office*